United States Patent [19]

Serreze

[11] Patent Number: 5,218,613

[45] Date of Patent: Jun. 8, 1993

[54] VISIBLE DIODE LASER

[75] Inventor: Harvey B. Serreze, Pound Ridge, N.Y.

[73] Assignee: McDonnell Douglas Corporation, St. Louis, Mo.

[21] Appl. No.: 877,152

[22] Filed: May 1, 1992

[51] Int. Cl.$^5$ ............................................. H01S 3/19
[52] U.S. Cl. ................................. 372/45; 257/13
[58] Field of Search .................. 372/45, 46; 257/12, 257/13, 14, 18

[56] References Cited

U.S. PATENT DOCUMENTS

| | | | |
|---|---|---|---|
| 4,841,533 | 6/1989 | Hayakawa et al. | 372/45 |
| 4,862,470 | 8/1989 | Suyama et al. | 372/45 |
| 5,075,743 | 12/1991 | Behfar-Rad | 372/45 |

OTHER PUBLICATIONS

High Power (1.4W) AlGaInP Graded Index Separate Confinement Heterostructure Laser, Applied Physics Letters, vol. 51, No. 21, pp. 1658–1660, Bour, et al., Nov. 1987.

Very Low Current Threshold Current AlGaInP-/GaInp Strained Single Quantum Well visible Laser Diode, Electronics Letters, vol. 26, p. 1375, Aug. 1990, Katsuyama, et al.

InGaAs/AlGaAs Strained Single Quantum Well Diode Lasers with Extremely Low Threshold Current Density and High Efficiency, Applied Physics Letters, vol. 57, p. 321, Jul. 1990, Choi, et al.

*Primary Examiner*—Georgia Y. Epps
*Attorney, Agent, or Firm*—Guy R. Gosnell; Benjamin Hudson, Jr.; Timothy H. Courson

[57] ABSTRACT

A semiconductor laser device comprised of GaInP/AlGaInP materials which efficiently produces visible light output with improved carrier confinement and decreased threshold current density levels. The laser diode uses a strained quantum well positioned between a pair of graded index confinement layers which are in turn positioned between a pair of cladding layers. The active region is preferably comprised of $Ga_y In_{1-y} P$ and the confinement layers are graded index layers comprised of $(Al_x Ga_{1-x})_{0.51} In_{0.49} P$ in which the value of x is linearly graded from 0.40 to a maximum value selected from the range of 0.8 to 1.0 in a direction away from the active region. The cladding layers are comprised of $(Al_x Ga_{1-x})_{0.51} In_{0.49} P$ in which the value of x is selected from the range 0.8 to 1.0. Bounding layers may be interdisposed between active region and the confinement layer on either side of the active region. The bounding layers are thin layers comprised of $(Al_x Ga_{1-x})_{0.51} In_{0.49} P$ in which the value of x is in the range of 0.2–0.3 in the preferred embodiment.

20 Claims, 1 Drawing Sheet

VISIBLE DIODE LASER

BACKGROUND OF THE INVENTION

This invention relates generally to semiconductor laser devices and more particularly to semiconductor laser devices operating at wavelengths less than 700 nanometers having relatively low threshold current values and improved carrier confinement capabilities.

Semiconductor laser devices are currently utilized for a variety of applications. In particular visible light laser diodes may be used for pumping of solid state lasers whose absorption spectra are in the visible wavelength range, optical recording, high definition television, medical devices and transmission through plastic optical fibers. Visible light diode lasers operating in the 630 to 680 nanometer wavelength range and utilizing GaInP/AlGaInP materials systems, however, have relatively high threshold current densities primarily due to poor carrier confinement.

A graded index separate confinement heterostructure (GRINSCH) structure has been reported by Bour and Shealy in Applied Physics Letters, Volume 51, (21), pages 1658-1660 in 1987 in an article entitled *High Power (1.4 W) AlGaInP Graded-Index Separate Confinement Heterostructure ($\lambda=658nm$)Laser*. The GRINSCH structure was an attempt to reduce the threshold current density of GaIn P/AlGaInP visible light diode lasers. Additionally, it has been reported in Electronics Letters, Volume 26, page 1375 in 1990 in an article by Katsuyama, et al. entitled *Very Low Threshold Current AlGaInP/GaInP strained Single Quantum Well Visible Diode Laser* that the use of a strained active layer or a strained quantum well rather than a lattice matched quantum well tends to decrease the threshold current density as well. However, in the GaInP/AlGaInP diode laser utilized by Katsuyama, et al. the strained layer quantum well was positioned between a pair of step index confinement layers and not a GRINSCH structure. While both of these approaches, graded index confinement layers and strained active layers when utilized individually have been partially successful in decreasing the threshold current density of a GaInP-/AlGaInP diode laser, the confinement is still desired to be improved and thus the threshold current density decreased in order to have more efficiently operating visible light diode lasers.

In an article entitled *InGaAs/AlGaAs Strained Single Quantum Well Diode Lasers with Extremely Low Threshold Current Density and High Efficiency* in Applied Physics Letters, Volume 57 (4), page 231 in 1990, Choi and Wang utilized bounding layers positioned about a quantum well in order to decrease the threshold current density of a semiconductor laser. Choi and Wang utilized a semiconductor laser comprised of InGaAs/AlGaAs which produces significantly longer wavelengths than a visible light diode laser comprised of GaInP/AlGaInP materials.

Therefore, it would be desirable for a semiconductor laser diode emitting visible light particularly in the spectra of 630 to 680 nanometers and comprised of GaInP-/AlGaInP material systems to have improved carrier confinement and thus a relatively low threshold current density so as to more efficiently produce the visible light output.

SUMMARY

There is provided by this invention a semiconductor laser device comprised of GaInP/AlGaInP materials which efficiently produces visible light output with improved carrier confinement and decreased threshold current density levels. The laser diode uses a strained quantum well positioned between a pair of graded index confinement layers which are in turn positioned between a pair of cladding layers. The active region is preferably comprised of $Ga_yIn_{1-y}P$, however, in an alternative embodiment additional aluminum was added to the active region in order to decrease the lasing wavelength. The confinement layers are graded index layers comprised of $(Al_xGa_{1-x})_{0.51}In_{0.49}P$ in which the value of x is linearly graded from 0.40 to a maximum value selected from the range of 0.80 to 1.0 in a direction away from the active region. The cladding layers are comprised of $(Al_xGa_{1-x})_{0.51}In_{0.49}P$ in which the value of x is selected from the range of 0.8 to 1.0. Bounding layers may be interdisposed between the active region and the confinement layer on either side of the active region. The bounding layers are thin layers comprised of $(Al_xGa_{1-x})_{0.51}In_{0.49}P$ in which the value of x is in the range of 0.2-0.3 in the preferred embodiment. This entire structure is formed upon a substrate and a buffer layer, typically comprised of GaAs. A P-cap layer is deposited upon the cladding layer positioned opposite the substrate. Subsequently, metalization layers are deposited on opposing major surfaces of the semiconductor device structure such that ohmic electrical contact can be maintained with the structure. Semiconductor layers are selected such that the quantum well active region and confinement layers form a P-N junction by being located between layers having N-type dopants on one side and P-side dopants on a second side for proper diode response. The semiconductor laser diode described herein efficiently produces output light having a wavelength in the range of approximately 630-680 nanometers while having improved carrier confinement and thus requiring relatively low threshold current densities for the resultant power levels achieved.

DETAILED DESCRIPTION OF THE PREFERRED EMBODIMENT

Figure 1:
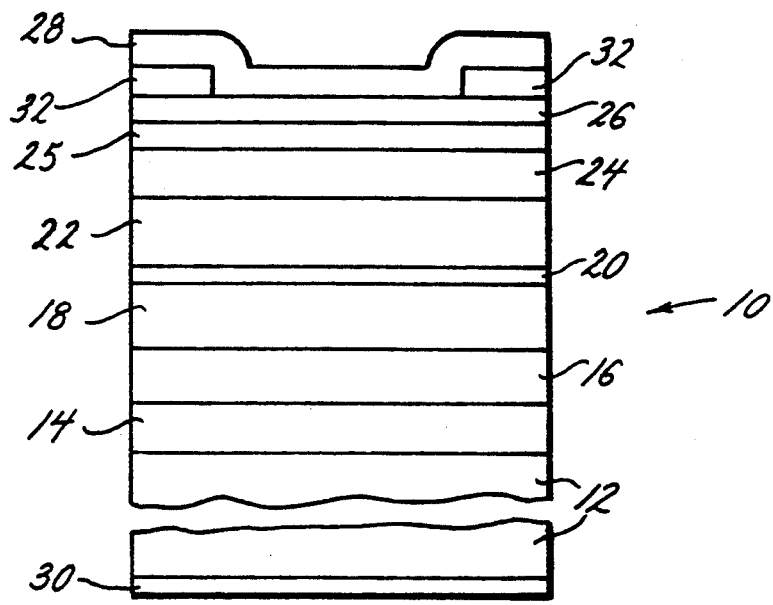
FIG. 1 illustrates a cross-sectional view of a semiconductor laser diode incorporating the principles of this invention.

Referring now to FIG. 1, there is shown a cross-sectional view of a semiconductor laser device 10 incorporating the principals of this invention. Upon an N-substrate layer 12, typically comprised of GaAs, there is deposited an N-buffer layer 14, an N-cladding layer 16, a first confinement layer 18, an active region 20, a second confinement layer 22, a P-cladding layer 24, a P-cap layer 26 and a P-metalization layer 28. On the opposing major surface of the N-substrate 12 from that on which the N-buffer layer 14 is deposited, an N-metal layer 30 is deposited.

The N-buffer layer 14 is comprised of the same material as that which forms the N-substrate layer 12, typically GaAs, so as to provide a uniform surface upon which to deposit the remaining layers of the semiconductor diode laser. The N-cladding layer 16 is comprised of an alloy of N-doped AlGaInP, preferably N-doped $(Sl_xGa_{1-x})_{0.51}In_{0.49}P$ wherein the value of x is selected from within the range of 0.80 to 1.0 depending upon the particular bandgap energy which the N-doped cladding layer 16 is desired to have with increased bandgap energy apparent as the mole fraction of aluminum is increased. Preferably, the value of x for the N-cladding layer 16 is selected to equal the maximum aluminum mole fraction in the first confinement layer 18 as hereinafter discussed. Additionally, the subscript values of 0.51 and 0.49 are selected such that the layers comprised of $(Al_xGa_{1-x})_{0.51}In_{0.49}P$ are lattice matched to the N-substrate layer 12. While the thickness of the N-doped cladding layer 16 may be varied in the preferred embodiment, the N-cladding layer 16 has a thickness of 0.80–1.20 micrometers preferably.

Upon the N-cladding layer 16, a first confinement layer 18 is formed of AlGaInP alloys. In particular the first confinement layer is a graded index confinement structure comprised of $(Al_xGa_{1-x})_{0.51}In_{0.49}P$ in which the value of x is graded from a maximum value selected from the range of 0.8 to 1.0 at the interface of the first confinement layer 18 and the N-cladding layer 16 to a value of 0.40 at the interface of the first confinement layer 18 and the active region 20. Preferably, the maximum value of x in the first confinement layer 18 is 0.8. The gradation is preferably linear although other types of grading such as parabolic may be utilized. As is well known to those skilled in the art, the gradation of aluminum mole fraction alters not only the index of refraction but also the energy bandgap level of the material so as to provide both optical and carrier confinement, respectively. The first confinement layer 18 is an undoped layer and while its thickness may be varied as desired in the preferred embodiment the first confinement layer 18 is approximately 0.2 micrometers thick.

Upon the first confinement layer 18 is deposited an active region 20 comprised of a $Ga_yIn_{1-y}P$ quantum well which is undoped. Preferably the value of y is 0.43, however, the ratio of Ga to In in the quantum well serves to adjust the strain of the layer as well as the wavelength of light produced and may thus be varied as desired. While the thickness of the quantum well may be varied somewhat as is known to those skilled in the art it is preferably 0.006–0.012 micrometers in thickness in the preferred embodiment. Additionally, the quantum well is formed such that it is strained in relation to the layers disposed on either side of the active region 20. Preferably, a quantum well is formed so as to be in compressive strain in relation to the layers disposed on either side of it, however, a quantum well in tensile strain would also be functional.

A second confinement layer 22 is deposited upon the quantum well active region 20. The second confinement layer 22 is structurally identical to the previously discussed first confinement layer 18 in that it is comprised of $(Al_xGa_{1-x})_{0.51}In_{0.49}P$ wherein the value of x is graded from a value 0.40 at the interface of the active region 20 and the second confinement layer 22 to a maximum value selected from the range of 0.8 to 1.0 at the interface of the second confinement layer 22 and the P-cladding layer 24. As with the first confinement layer 18, the preferred maximum value of x in the second confinement layer 22 is 0.8 and the gradation of the second confinement layer 22 is preferably linear, but may be other types of gradation such as parabolic. The second confinement layer 22 is also undoped and while its thickness may be varied as desired, it is preferably approximately 0.2 micrometers in thickness. As with the first confinement layer, the gradation of the aluminum mole fraction serves to both gradually increase the bandgap of the confinement layer and decrease the index of refraction in a direction away from the quantum well to provide enhanced carrier and optical confinement, respectively.

A P-cladding layer 24 is deposited upon the second confinement layer 22. The P-cladding layer 24 is doped with a P-type dopant and is formed of $(Al_xGa_{1-x})_{0.51}In_{0.49}P$ wherein the value of x is selected from the range of 0.80 to 1.0 with increased bandgap energies apparent as the mole fraction of aluminum is increased. In the preferred embodiment, the value of x in the P-cladding layer 24 is selected to equal the maximum aluminum mole fraction in the second confinement layer 22. While the thickness of the P-cladding layer 24 may be varied as desired, it is preferably in the range of 0.80–1.20 micrometers.

On the P-cladding layer 24 is deposited a P-cap layer 26 and a P-metalization layer 28. The P-cap layer 26 is P-doped and comprised of the same material as that forming the N-substrate 12, typically P-doped GaAs. Additionally, while the thickness of the P-cap layer 26 may be varied, it is preferably in the range of 0.10–0.20 micrometers in thickness. An optional intermediary cap layer 25 may be interdisposed between the P-cladding layer 24 and P-cap layer 26 in order to reduce the barrier between the layers and improve the operating efficiency of the laser diode. The optional intermediary cap layer 25 is formed of P-doped GaInP whose thickness, although it may vary as desired, is preferably within the range of 0.08–0.12 micrometers. The P-metalization layer 28 may be of any metal such that ohmic electrical contact may be maintained with the P-side of the semiconductor diode structure 10. For example, titanium/platinum/gold metal may be utilized to form the P-metalization layer 28. The N-metalization layer 30 formed on the opposing major surface of the N-substrate 12 from that on which the N-buffer layer 14 is formed may also be of any suitable metal such that ohmic electrical contact may be maintained with the N-side of the semiconductor device 10. A typical N-metalization layer 30 may be comprised of a gold/germanium/nickel/gold metal.

Figure 2:
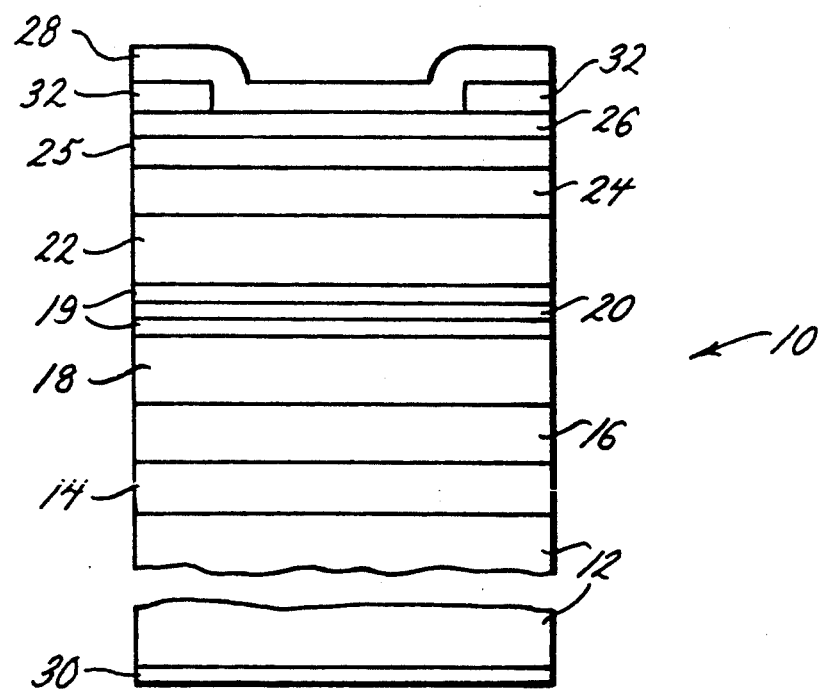
FIG. 2 illustrates a cross-sectional view of a semiconductor laser diode incorporating bounding layers for increased carrier confinement.

In order to further enhance the carrier confinement of the visible light diode laser heretofore described and thus decrease the threshold current density, a pair of bounding layers 19 may be interdisposed on either side of the active region 20 as shown in FIG. 2. Each bounding layer 19 is a thin layer comprised of $(Al_xGa_{1-x})_{0.51}In_{0.49}P$ wherein the value of x is selected to be in the range of 0.20–0.30. The bounding layers 19 should have a thickness approximating that of the active region 20. Thus, in the preferred embodiment in which the active region 20 has a thickness of approximately 0.006–0.012 micrometers, the bounding layers 19 should have thicknesses in the range of 0.004–0.008 micrometers. Additionally the bounding layers 19 should be undoped and be formed to lattice match the confinement layer adjacent thereto. The active region 20 should be formed so as to be strained in relation to the adjacent bounding layers 19, preferably in compressive strain in comparison thereto. The bounding layers 19 have a slightly larger bandgap than the quantum well although a slightly smaller bandgap than the portion of the confinement layers adjacent to the bounding layers 19. These thin bounding layers 19 serve to further confine the carriers due to their step increase in bandgap difference in comparison to the active region 20 to further decrease the threshold current density of the semiconductor laser device. The bounding layers 14 also serve as a convenient location to interrupt or delay the epitaxial growth of the structure as so desired.

As is well known to those skilled in the art, the N and P designations for the various semiconductor layers refer to the type of dopants introduced therein. For the layers having an N-type dopant such as the N-substrate 12, the N-buffer layer 14, and the N-cladding layer 16, suitable N-type dopants include silicon, selenium, and sulfur, wherein silicon is preferably utilized. Likewise, for layers having a P-type dopant introduced therein such as the P-cladding layer 24, the P-cap layer 26, and the optional intermediary P-cap layer 25 if utilized, suitable P-type dopants include zinc, magnesium, and beryllium, wherein zinc is preferably utilized. The dopant concentration is well known to those skilled in the art and may be varied as required for the particular application.

While the optional bounding layers 19 and confinement and cladding layers provide transverse carrier confinement for the visible light diode layer structure 10, lateral carrier confinement is provided by means of an oxide stripe as is well known to those skilled in the art and is shown in FIGS. 1 and 2. In particular, a dielectric layer 32 such as silicon dioxide $SiO_2$ is deposited upon the P-cap layer 26. Subsequently, a longitudinal stripe is etched within the dielectric layer 32 such that the P-cap layer 26 is exposed within the stripe. The P-metalization layer 28 is then deposited both in the stripe as well as across the surface of the dielectric layer, however, the dielectric layer 32 serves to insulate the semiconductor diode structure 10 from electrical contact from the P-metalization layer 28 except in the striped portion of the structure in which the P-metalization layer makes contact with the P-cap layer 26 such that lasing action can occur thereunder.

The semiconductor laser device 10 described herein is capable of operating efficiently within a visible band of wavelengths from approximately 650–680 nanometers. An alternative embodiment in which the composition of the active layer 20 is altered is hereinafter described in order to provide a semiconductor laser device capable of efficient operation at slightly lower wavelength such as in the range of 630–650 nanometers. In particular, aluminum is added to the composition of the active layer 20 in the alternative embodiment. Particularly, the quantum well 20 of the alternative embodiment is comprised of $(Al_xGa_{1-x})_{0.41}In_{0.59}P$ wherein x is selected from the range of 0 to 0.30. As the value of x increases from 0 to 0.30, the lasing wavelength decreases slightly to a value of approximately 630 nanometers for an aluminum mole fraction, x, of 0.278 and a resulting molecular formula of $(Al_{0.278}Ga_{0.722})_{0.41}In_{0.59}P$. As in the preferred embodiment, the active layer 20 is undoped and is formed so as to be a strained layer in comparison to the layers disposed adjacent thereto. Additionally, the thickness of the quantum well is variable but is preferably in the range of 0.006–0.012 micrometers. The lasing wavelength decreases in the alternative embodiment as the aluminum mole fraction is increased, however, the energy bandgap of the active region in the alternative embodiment is also increased as the aluminum mole fraction is increased. Thus, in order to achieve appropriate carrier confinement, the layers disposed adjacent to the alternative active region 20 must have sufficiently large energy bandgaps. If no bounding layers 19 are utilized, the first and second confinement layers previously discussed have sufficiently large bandgap energy levels to provide appropriate carrier confinement. However, should bounding layers 19 be desired to be interdisposed between the confinement layers and the active region 20, the aluminum mole fraction of the bounding layers 19 should be larger than that previously described in order to increase the bandgap difference of the bounding layers 19 and therefore increase the carrier confinement capability. In particular for the alternative quantum well described, the bounding layers in the alternative embodiment should be comprised of $(Al_xGa_{1-x})_{0.51}In_{0.49}P$ in which the value of x is in the range of 0.30–0.40 in order to appropriately confine the carriers in the alternative active region 20 and thus produce light having a shorter wavelength of approximately 630–650 nanometers.

Although there has been illustrated and described specific detail and structure of operations it is clearly understood that the same were merely for purposes of illustration and that changes and modifications may be readily made therein by those skilled in the art without departing from the spirit and scope of this invention.

What is claimed is:

1. A semiconductor laser, comprising:
   (a) a semiconductor substrate; and
   (b) a plurality of semiconductor layers, positioned upon said semiconductor substrate, comprising:
   (1) a quantum well region comprised of $Ga_yIn_{1-y}P$ for propagating optical signals along an axis of propagation, said quantum well region having a PN junction proximate thereto, and wherein said quantum well region is formed to be strained relative to layers disposed adjacent thereto;
   (2) a first graded index layer comprised of $(Al_xGa_{1-x})_{0.51}In_{0.49}P$ having a graded index of refraction disposed adjacent a first side of said quantum well region, said graded index of refraction being largest at the interface of said first graded index layer and said quantum well region and decreasing in a direction away from said quantum well region; and
   (3) a second graded index layer comprised of $(Al_xGa_{1-x})_{0.51}In_{0.49}P$ having a graded index of refraction disposed adjacent a second side of said quantum well region, said graded index of refraction being largest at the interface of said second graded index layer and said quantum well region and decreasing in a direction away from said quantum well region.

2. A semiconductor laser as recited in claim 1 wherein both said first and second graded index layers comprised of $(Al_xGa_{1-x})_{0.51}In_{0.49}P$ have a value of x which varies from a minimum of approximately 0.40 at said interface of said graded index layer and said quantum well region to a maximum value selected from the range of 0.80 to 0.1 in a direction away from said quantum well region.

3. A semiconductor laser as recited in claim 2 wherein said quantum well region comprised of $Ga_yIn_{1-y}P$ has a value of y of approximately 0.43.

4. A semiconductor laser as recited in claim 3, further comprising:

(a) a first bounding layer comprised of $(Al_xGa_{1-x})_{0.51}In_{0.49}P$, said first bounding layer interdisposed between said first graded index layer and said quantum well region; and (b) a second bounding layer comprised of $(Al_xGa_{1-x})_{0.51}In_{0.49}P$, said second bounding layer interdisposed between said second graded index layer and said quantum well region.

5. A semiconductor laser as recited in claim 4 wherein both said first and second bounding layers comprised of $(Al_xGa_{1-x})_{0.51}In_{0.49}P$ have a value of x selected from the range of 0.20 to 0.30.

6. A semiconductor laser as recited in claim 5, further comprising:

(a) a first cladding layer comprised of $(Al_xGa_{1-x})_{0.51}In_{0.49}P$, said first cladding layer positioned adjacent said first graded index layer; and (b) a second cladding layer comprised of $(Al_xGa_{1-x})_{0.51}In_{0.49}P$, said second cladding layer positioned adjacent said second graded index layer.

7. A semiconductor laser as recited in claim 6 wherein both said first and second cladding layers comprised of $(Al_xGa_{1-x})_{0.51}In_{0.49}P$ have a value of x selected from the range of 0.80 to 1.0.

8. A semiconductor laser as recited in claim 7 wherein both said first and second cladding layers comprised of $(Al_xGa_{1-x})_{0.51}In_{0.49}P$ have a value of x selected to approximately equal said maximum value of x in said first and second graded index layers.

9. A semiconductor laser as recited in claim 7 wherein said quantum well region has a thickness selected from the range of 0.006 micrometers to 0.012 micrometers.

10. A semiconductor laser as recited in claim 7 wherein both said first and second bounding layers have a thickness selected from the range of 0.004 micrometers to 0.008 micrometers.

11. A semiconductor laser, comprising:
(a) a semiconductor substrate; and
(b) a plurality of semiconductor layers, positioned upon said semiconductor substrate, comprising:

(1) a quantum well region comprised of $(Al_zGa_{1-z})_{0.41}In_{0.59}P$ for propagating optical signals along an axis of propagation, said quantum well region having a PN junction proximate thereto, and wherein said quantum well region is formed to be strained relative to layers disposed adjacent thereto;

(2) a first graded index layer comprised of $(Al_xGa_{1-x})_{0.51}In_{0.49}P$ having a graded index of refraction disposed adjacent a first side of said quantum well region, said graded index of refraction being largest at the interface of said first graded index layer and said quantum well region and decreasing in a direction away from said quantum well region; and (3) a second graded index layer comprised of $(Al_xGa_{1-x})_{0.51}In_{0.49}P$ having a graded index of refraction disposed adjacent a second side of said quantum well region, said graded index of refraction being largest at the interface of said second graded index layer and said quantum well region and decreasing in a direction away from said quantum well region.

12. A semiconductor laser as recited in claim 11 wherein both said first and second graded index layers comprised of $(Al_xGa_{1-x})_{0.51}In_{0.49}P$ have a value of x which varies from a minimum of approximately 0.40 at said interface of said graded index layer and said quantum well region to a maximum value selected from the range of 0.80 to 1.0 in a direction away from said quantum well region.

13. A semiconductor laser as recited in claim 12 wherein said quantum well region comprised of $(Al_zGa_{1-z})_{0.41}In_{0.59}P$ has a value of z selected from the range of 0.0 to 0.30.

14. A semiconductor laser as recited in claim 13, further comprising:

(a) a first bounding layer comprised of $(Al_xGa_{1-x})_{0.51}In_{0.49}P$, said first bounding layer interdisposed between said first graded index layer and said quantum well region; and (b) a second bounding layer comprised of $(Al_xGa_{1-x})_{0.51}In_{0.49}P$, said second bounding layer interdisposed between said second graded index layer and said quantum well region.

15. A semiconductor laser as recited in claim 14 wherein both said first and second bounding layers comprised of $(Al_xGa_{1-x})_{0.51}In_{0.49}P$ have a value of x selected from the range of 0.30 to 0.40.

16. A semiconductor laser as recited in claim 15, further comprising:

(a) a first cladding layer comprised of $(Al_xGa_{1-x})_{0.51}In_{0.49}P$, said first cladding layer positioned adjacent said first graded index layer; and (b) a second cladding layer comprised of $(Al_xGa_{1-x})_{0.51}In_{0.49}P$, said second cladding layer positioned adjacent said second graded index layer.

17. A semiconductor laser as recited in claim 16 wherein both said first and second cladding layers comprised of $(Al_xGa_{1-x})_{0.51}In_{0.49}P$ have a value of x selected from the range of 0.80 to 1.0.

18. A semiconductor laser as recited in claim 17 wherein both said first and second cladding layers comprised of $(Al_xGa_{1-x})_{0.51}In_{0.49}P$ have a value of x selected to approximately equal said maximum value of x in said first and second graded index layers.

19. A semiconductor laser as recited in claim 17 wherein said quantum well region has a thickness selected from the range of 0.006 micrometers to 0.012 micrometers.

20. A semiconductor laser as recited in claim 17 wherein both said first and second bounding layers have a thickness selected from the range of 0.004 micrometers to 0.008 micrometers.

* * * * *